United States Patent
Puthumana et al.

(10) Patent No.: US 12,489,428 B2
(45) Date of Patent: Dec. 2, 2025

(54) ADAPTIVE SLOPE COMPENSATION IN SOLENOID DRIVERS TO AVOID INSTABILITY IN CURRENT REGULATION

(71) Applicant: TEXAS INSTRUMENTS INCORPORATED, Dallas, TX (US)

(72) Inventors: Sreenath Puthumana, Bangalore (IN); Ganapathi Shankar, Bangalore (IN); Venkata Naresh Kotikelapudi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 18/240,605

(22) Filed: Aug. 31, 2023

(65) Prior Publication Data

US 2025/0080088 A1    Mar. 6, 2025

(51) Int. Cl.
*H03K 3/017* (2006.01)
*H01F 7/06* (2006.01)

(52) U.S. Cl.
CPC ............ *H03K 3/017* (2013.01); *H01F 7/064* (2013.01)

(58) Field of Classification Search
CPC ............................... H03K 3/017; H01F 7/064
See application file for complete search history.

(56) References Cited

U.S. PATENT DOCUMENTS

| | | | |
|---|---|---|---|
| 2022/0060109 A1* | 2/2022 | Wollschlager | H02M 3/156 |
| 2023/0213957 A1* | 7/2023 | Hu | G05F 1/575 |
| | | | 323/280 |
| 2023/0261575 A1* | 8/2023 | Biziitu | H02M 1/0025 |
| | | | 323/271 |
| 2024/0405663 A1* | 12/2024 | Hsu | H02M 1/088 |

OTHER PUBLICATIONS

David Vaseliou et al. "Using Motor Drivers to Drive Solenoids" Published Feb. 2019—Revised Apr. 2022.

* cited by examiner

*Primary Examiner* — Sibin Chen
(74) *Attorney, Agent, or Firm* — Mandy Barsilai Fernandez; Frank D. Cimino

(57) ABSTRACT

A circuit includes an amplifier having a first input, a reference input, and an output. A pulse width modulator (PWM) controller has an input coupled to the output of the amplifier. A first switch has a control terminal coupled to an output of the PWM controller. A second switch has a second terminal coupled to the second terminal of the first switch, and has a control terminal coupled to the output of the PWM controller. An input of a current sensor is coupled to the second terminal of the first switch and is coupled to a second terminal of the second switch. An output of the current sensor is coupled to the first input of the amplifier. A duty cycle monitoring and reference signal adjustment circuit has an input coupled to the output of the PWM controller and has an output coupled to the reference input of the amplifier.

20 Claims, 7 Drawing Sheets

ADAPTIVE SLOPE COMPENSATION IN SOLENOID DRIVERS TO AVOID INSTABILITY IN CURRENT REGULATION

BACKGROUND

A solenoid is an electromagnetic actuator that converts electrical current to linear or rotational motion with a coil of wire. Solenoids, which may also be referred to as solenoid valves, solenoid switches, or "metal can" relays, have become more frequently used in automotive and industrial applications for actuation of loads, valves, and as electromechanical switches. For example, solenoids can be used to regulate fluid control (e.g., water dispensing systems, air pressure systems, and/or vacuum systems). Some example solenoid applications include home appliances, printers, heating-venting-air conditioning (HVAC) systems, irrigation systems, and/or engine and transmission control systems.

SUMMARY

Some examples relate to a circuit. The circuit includes an amplifier having a first input, a reference input, and an output. A pulse width modulator (PWM) controller has an input coupled to the output of the amplifier and has an output. A first switch has a first terminal, a second terminal, and a control terminal. The control terminal of the first switch is coupled to the output of the PWM controller. A second switch has a first terminal, a second terminal, and a control terminal. The second terminal of the second switch is coupled to the second terminal of the first switch, and the control terminal of the second switch coupled to the output of the PWM controller. A current sensor has an input and an output. The input of the current sensor is coupled to the second terminal of the first switch and is coupled to the second terminal of the second switch. The output of the current sensor is coupled to the first input of the amplifier. A duty cycle monitoring and reference signal adjustment circuit has an input coupled to the output of the PWM controller and has an output coupled to the reference input of the amplifier.

Some examples relate to a method. The method provides a first reference signal. The first reference signal has a first slope for a first pulse-width modulated (PWM) clock cycle of a PWM signal. The first PWM clock cycle has a first duty cycle. The method provides a first reference signal with the first slope for a second PWM clock cycle of the PWM signal. The second PWM clock cycle has a second duty cycle. The method detects a difference between the first duty cycle and the second duty cycle. The method provides a second reference signal having a second slope responsive to the difference between the first duty cycle and the second duty cycle.

Some examples relate to a circuit. The circuit includes a first switch having a first terminal, a second terminal, and a control terminal. The first terminal of the first switch is coupled to a first supply voltage terminal. A second switch has a first terminal, a second terminal, and a control terminal. The first terminal of the second switch is coupled to a second supply voltage terminal, and the second terminal of the second switch is coupled to the second terminal of the first switch. A pulse width modulator (PWM) controller has an input and an output. The output is configured to provide a first PWM signal to the control terminal of the first switch and a second PWM signal to the control terminal of the second switch. An amplifier has a first input terminal, a second input terminal, and an output terminal. The first input terminal of the amplifier is coupled to the second terminal of the first switch and to the second terminal of the second switch. The second input terminal of the amplifier is configured to receive a reference signal that has a time-varying slope. A duty cycle monitoring and reference signal adjustment circuit is configured to monitor the PWM signal and change the slope of the reference signal based on a change in duty cycle of the PWM signal.

DETAILED DESCRIPTION

The drawings are not drawn to scale.

Some examples pertain to improved techniques for driving a solenoid using a pulse-width modulated (PWM) signal. In some circumstances, an operating condition of the solenoid can change over time. For example, a supply voltage provided to the solenoid can decrease. This change in operating condition can lead to an unexpected change in the PWM signal, which can in turn cause instabilities in the solenoid operation. To keep this change in operating condition from creating instabilities in the solenoid operation, the present description includes a duty cycle monitoring and adjustment circuit that monitors the duty cycle of the PWM signal. If there is an unexpected change in the duty cycle of the PWM signal, then the duty cycle monitoring and adjustment circuit can adjust the PWM signal to keep the solenoid in a stable operating mode.

Figure 1:
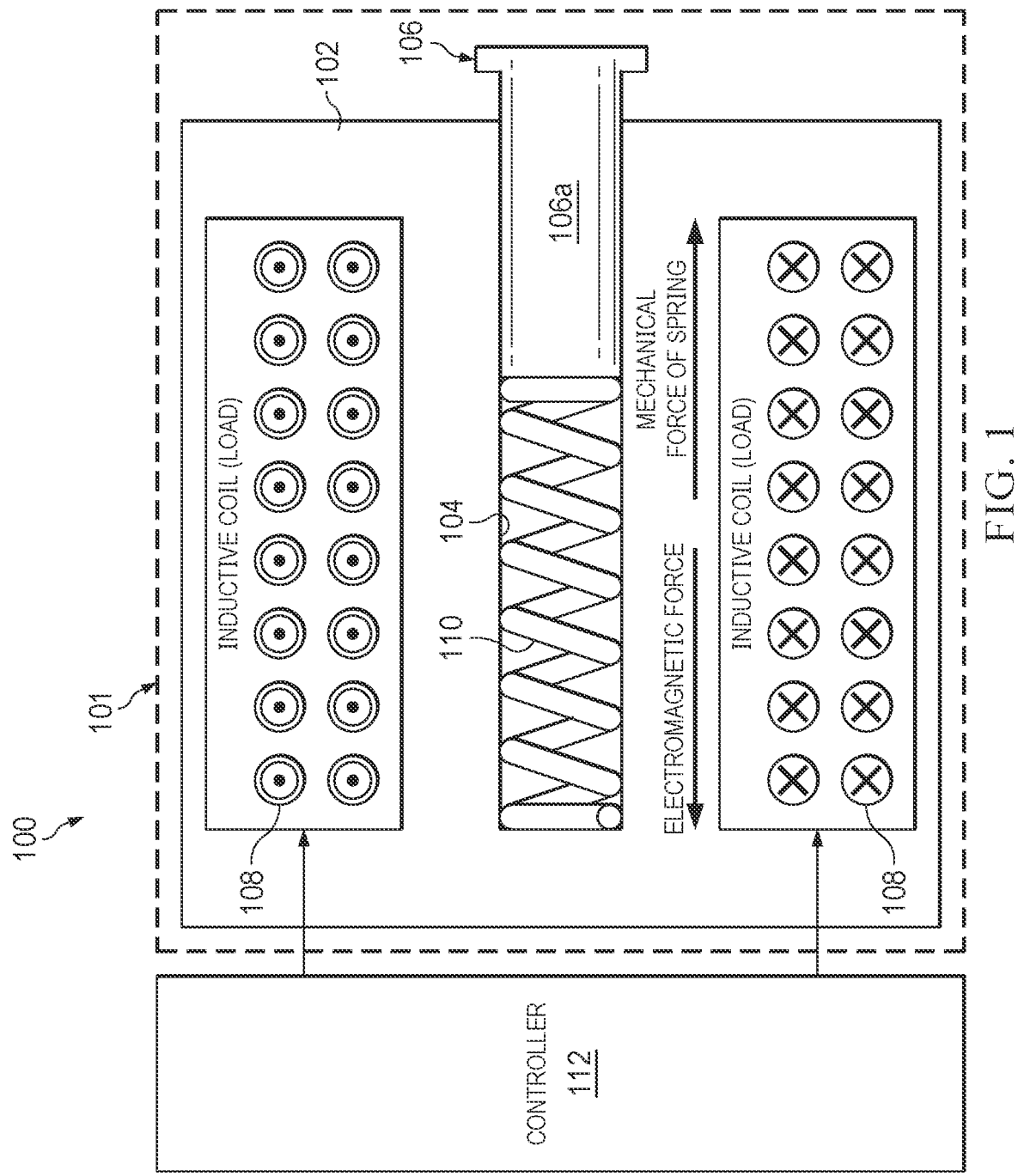
FIG. 1 is a cross-sectional schematic of an example electromechanical system including a solenoid.

FIG. 1 shows a cross-sectional view of an example solenoid system 100 that includes a solenoid 101 that is driven by a controller 112. Solenoid 101 includes a frame 102 having a shaft or cavity 104, a plunger 106, a conductive coil 108, and a return spring 110. The plunger 106, which can for example be made of a ferromagnetic material such as iron, includes a member 106a that is axially aligned with the cavity 104. The conductive coil 108 wraps around the cavity 104, and the return spring 110 is arranged between the plunger 106 and the frame 102. Consistent with Ampere's law, a change in current through the coil 108 induces a change in magnetic field. Therefore, during operation, the controller 112 controls current flow through the coil 108 to control the magnetic field provided by the coil 108. In particular, the electromagnetic force due to the current flowing through the coil 108 counteracts the mechanical force of the spring 110 to facilitate "push" and "pull" movement of the plunger 106.

Figure 2:
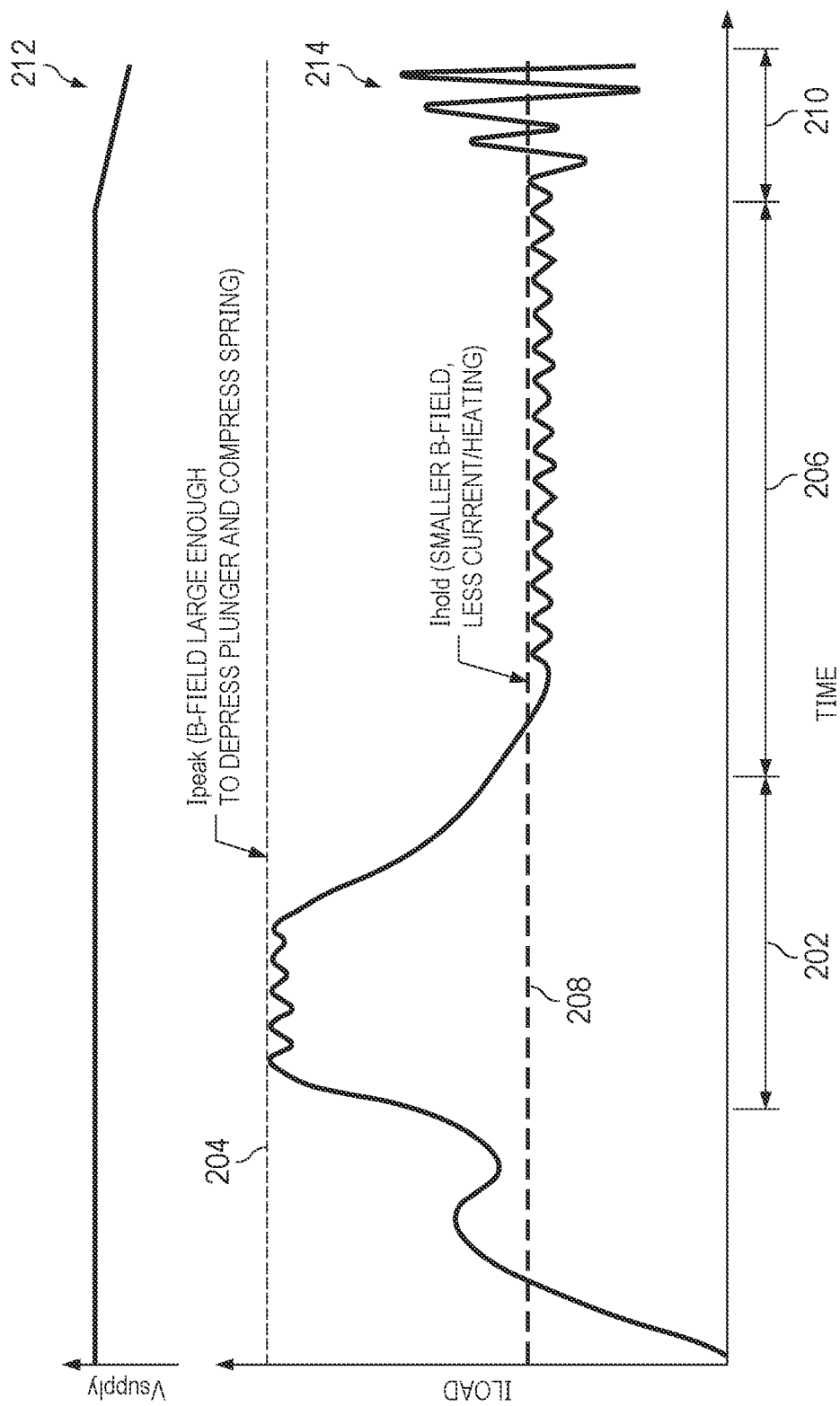
FIG. 2 is an example waveform diagram for driving a solenoid.

FIG. 2 shows an example of how current (ILoad) can be regulated in the solenoid 101 to provide controlled "pushpull" movement of the plunger 106 in FIG. 1. During time 202 of FIG. 2, a first charging current level 204 (referred to as "peak current") is drawn or driven into the coil 108. During peak current 204, the magnetic field provides an electromagnetic force of sufficient magnitude to overcome the mechanical force of the spring 110, thereby driving the plunger 106 into the cavity 104 and depressing the spring 110. During time 206, to maintain the plunger 106 in this position, the controller 112 drives or draws a second charging current level 208 (referred to as "hold current") into the coil 108. The second charging current level 208 is less than the first charging current level 204, but still is of sufficient magnitude to "hold" the plunger in place and counteract the force of the spring 110.

A nuance of this general scheme is that the coil heats up responsive to current passing through the coil 108 (e.g., due to IR losses). As the coil heats-up, the coil has a larger resistance, which can lead to unintentional de-actuation or failure to actuate the solenoid. Because the hold current level 208 is lower than the peak current 204, the use of these two different current levels helps to minimize power consumption and solenoid heating somewhat. To further limit power dissipation, the hold current level can be regulated by using pulse width modulation (PWM). PWM can be used to regulate the current through the coil to different levels at different times by varying the duty cycle of the PWM signal. The duty cycle is the ratio or percentage of time that the PWM signal is in an active state, e.g., high voltage, versus an inactive state, e.g., low voltage, for a single PWM clock cycle. Thus, by reducing current in the coil, PWM techniques limit heating of the solenoid and maintain a relatively stable resistance in the coil for a more reliable operation.

Changes in operating conditions of the solenoid can lead to instabilities for the solenoid. For example, changes in the supply voltage for the solenoid during time 210 can lead to unexpected changes in the duty cycle of a PWM signal that drives the solenoid. For instance, time 210 in FIG. 2 reflects an example where the hold current to become unstable responsive to a change in supply voltage (see e.g., 212, 214). If these unexpected duty cycle changes are left unabated, they can lead to chattering, sparking, and/or overheating of the solenoid; and can ultimately lead to premature failure of the solenoid (including unintentional de-actuation or failure to actuate the solenoid, among others).

Accordingly, described examples relate to solenoid controllers that monitor the duty cycle used to drive a solenoid over multiple PWM clock cycles. In particular, for a first PWM clock cycle, a first duty cycle is controlled responsive to a reference signal having a first slope. Then, for a second PWM clock cycle, a second duty cycle is controlled responsive to the reference signal having the first slope. If operating conditions are stable, the first and second duty cycles actually achieved for the first and second PWM clock cycles, respectively, are the same. However, if the operating conditions are changing, for example if the supply voltage "dips" and/or there is a significant temperature change, the second duty cycle may change relative to the first duty cycle responsive to the change in operating conditions. For example, if the first duty cycle is 45% low and 55% high for the first PWM clock cycle, the second duty cycle could shift to 20% low and 80% high for the second PWM clock cycle even though the same reference signal is provided-indicating that an instability is rising in the system.

Hence, the described example solenoid controllers monitor the duty cycle used to drive the solenoid. If the duty cycle changes by more than some threshold amount when the same reference signal is applied, the solenoid controller can adjust the slope of the reference signal for a later PWM clock cycle to "tune" the PWM signal to bring the solenoid back to a stable operating point. In this way, described examples provide for adaptive slope compensation in solenoid drivers to avoid instability in operation of the solenoid.

Figure 3:
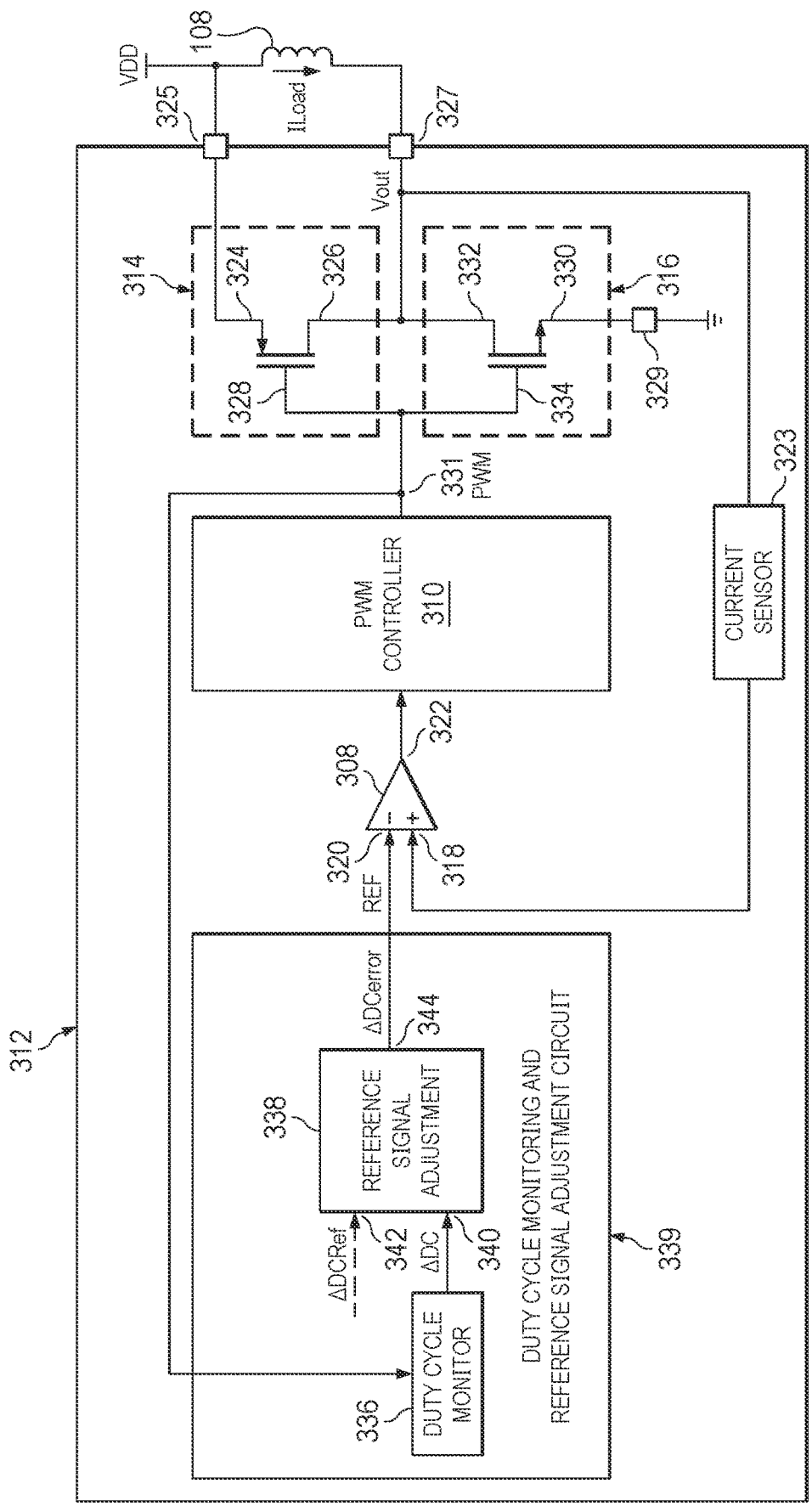
FIG. 3 is a circuit schematic of an example electromechanical system including a solenoid with adaptive slope compensation.

FIG. 3 illustrates an example of a controller 312 that may implement the functions of the controller 112 used to drive the conductive coil 108. The controller 312 includes amplifier 308, PWM controller 310, high-side switch 314, low-side switch 316, and a current sensor 323. Amplifier 308 has a first amplifier input 318, a second amplifier input 320, and an amplifier output 322. PWM controller 310 has a PWM input coupled to the amplifier output, and a PWM controller output 331 that provides a PWM signal. The high-side switch 314, which is illustrated as a p-type metal oxide semiconductor (PMOS) transistor, has a first terminal 324 (e.g., drain), a second terminal 326 (e.g., source), and a control terminal 328 (e.g., gate). Terminal 324 is coupled to a first supply voltage terminal 325 (e.g., that receives a first supply voltage (e.g., VDD)). Terminal 326 is coupled to a solenoid driver terminal 327 and to the first amplifier input 318, and terminal 328 is coupled to the PWM output. The low-side switch 316, which is illustrated as an n-type metal oxide semiconductor (NMOS) transistor, has first terminal 330 (e.g., source), a second terminal 332 (e.g., drain), and a control terminal 334 (e.g., gate). Terminal 330 is coupled to a second supply voltage terminal 329 that receives a second supply voltage (e.g., electrical ground GND). Terminal 332 is coupled to the solenoid driver terminal 327 and first amplifier input 318, and terminal 334 is coupled to the PWM controller output 331. Although switches 314, 316 are illustrated as MOS transistors, other transistors, such as bipolar junction transistors (BJT), and other field-effect transistors (FETs) such as fin-field-effect transistors (FinFETs) and/or junction field effect transistors (JFETs)), could also be used. In an example, terminals 325 and 327 are pins of an integrated circuit (IC), such as a solder ball, solder bump, bond pad, conductive post, or other conductive pin.

The high-side switch 314 and low-side switch 316 are activated and deactivated in response to a PWM signal from the PWM controller output 331. The high-side switch 314 and low-side switch 316 are complementary. Thus, the high-side switch 314 is activated (e.g., conducting) when the low-side switch 316 is de-activated (e.g., non-conducting); and vice versa. The high-side switch 314 couples the solenoid driver terminal 327 to the first supply voltage, terminal and pulls the voltage of the solenoid driver terminal 327 "up". Conversely, the low-side switch 316 couples the solenoid driver terminal 327 to the second supply voltage terminal, and pulls the voltage of the solenoid driver terminal 327 "down".

Current sensor 323 measures or detects the current on 327 and converts that measured/detected current to a voltage on input 318 to regulate coil/solenoid current. In some examples, the current sensor is an integrated current sensor that is located on the same chip or die as 310, 314, and 316. The current sensor 323 can provide an analog voltage, an analog current, or a digital output to 318.

The signal on 318 generally tracks the current (ILoad) on 327, which generally tracks the reference signal (Ref) provided on 320. Thus, if the reference signal (Ref) changes in time to represent a target peak current (e.g., 204 of FIG. 2) or a target hold current (e.g., 206 of FIG. 2), the amplifier 308 and PWM controller 310 adjust the duty cycle of the PWM signal on PWM controller output 331 to change the percentage of time the high-side switch 314 and low-side switch 316 are activated and de-activated. In alternative examples, the current sensor 323 can be omitted, and the amplifier 308 can compare the output voltage (Vout) to the voltage of the reference signal (Ref).

Consider an example where the reference signal (Ref) starts at a voltage of 2.5 V to indicate a hold current is to be provided by the controller 312, and the corresponding duty cycle of the PWM clock cycle is correspondingly at 35%. A duty cycle of 35% corresponds to or provides for a PWM signal that is at a high voltage for 35% of each PWM clock cycle, in which the high-side switch 314 is correspondingly "on" and low-side transistor 316 is "off" for 35% of each PWM clock cycle. Also, a duty cycle of 35% corresponds to or provides for a PWM signal that is at a low voltage for the other 65% of each PWM clock cycle, in which the high-side switch 314 is correspondingly "off" and low-side transistor 316 is "on" for 65% of each PWM clock cycle, or vice versa.

Subsequently, Ref increases to a higher voltage level to indicate a peak current is to be provided to the coil 108. Responsively, the output current on 327 is lower than expected. Hence, the voltage on 318 is initially lower than the higher voltage level for Ref. Accordingly, the amplifier 308 changes its output, responsive to which the PWM controller 310 provides a PWM signal on PWM output 331 having a change in the duty cycle. In particular, the amplifier 308 and PWM controller 310 could increase the duty cycle. For example, the amplifier could increase the duty cycle to 45% so the high-side switch 314 is "on" for 45% of the PWM clock cycle to "pull-up" the output current on 327 (and voltage on 318) more than it was during the 35% duty cycle. In this basic manner, the amplifier 308, PWM controller 310, high-side switch 314, low-side switch 316, and integrated current sensor 323 control the current (ILoad) delivered to the coil 108. By controlling the current (ILoad) in the coil 108, the magnetic field is responsive to changes in the current (ILoad) and can induce actuation of a plunger or other solenoid component as previously described with regards to FIGS. 1 and 2.

As previously mentioned, if the operating conditions are changing, for example if the supply voltage on terminal 325 "dips", the change in operating conditions can induce an unexpected change in PWM duty cycles over various PWM clock cycles. For example, if the reference signal on 320 initially has a constant, non-zero slope that is repeated for each of the first and second PWM clock cycles, the duty cycle could shift for the second PWM clock cycle even though the same reference signal is provided for both PWM clock cycles. This shift in duty cycle can indicate that an instability is rising in the system. For instance, even when the same fixed slope is applied for the first and second PWM clock cycles, the duty cycle could be 45% low and 55% high for the first PWM clock cycle and shift to 20% low and 80% high for the second PWM clock cycle.

To prevent this change in duty cycle from causing instability in the solenoid, the controller 312 includes a duty cycle monitoring circuit 336 and a reference signal adjustment circuit 338. The duty cycle monitoring circuit 336 has an input coupled to the PWM controller output 331, and has an output coupled to the second amplifier input 320 through the reference signal adjustment circuit 338. The reference signal adjustment circuit 338 has a first input 340, a second input 342 (also called a duty cycle reference input), and an output 344. The first input 340 is coupled to the output of the duty cycle monitoring circuit 336. The output 344 is coupled to the second amplifier input 320.

The duty cycle monitoring circuit 336 monitors the PWM signal on PWM controller output 331 and determines a duty cycle difference (ΔDC) between a first duty cycle of the PWM signal and a second duty cycle of the PWM signal. The duty cycle monitoring circuit 336 provides the duty cycle difference ΔDC to the first input 340. The duty cycle difference (ΔDC) is compared to a duty cycle difference threshold ΔDCRef on 342, and an error signal (ΔDCerror) is provided on 344. A PWM signal on PWM output 331 is adjusted in response to the error signal ΔDCerror. Accordingly, the duty cycle monitoring circuit 336 and reference signal adjustment circuit 338 change Ref signal (e.g., a slope of the Ref signal) in response to a change in the PWM duty cycle (ΔDC) being greater than the duty cycle difference threshold (ΔDCRef). The duty cycle of PWM signal on PWM controller output 331 is changed responsive to the change in the Ref signal to mitigate instability and maintain the solenoid in a stable operating condition.

In some examples, the controller 312 is included in a solenoid system, such as solenoid system 100 that drives coil 108. In other examples, the controller 312 is a standalone chip that includes an integrated circuit arranged on one or more semiconductor substrates, and/or includes multiple chips and/or discrete components on a printed circuit board. The semiconductor substrate may be a monocrystalline silicon substrate or a silicon on insulator substrate, but can also include other semiconductor materials, such as gallium arsenide (GaAs), indium gallium arsenide (InGaAs), and germanium (Ge), among others. Further, the chip(s) can include an application specific integrated circuit (ASIC) that includes logic blocks of transistors arranged to specifically carry out the functions of the controller 312. For example, the ASIC carries out the functions of one or more of the elements 308, 310, 323, 336, and 338. In other examples, the controller 312 can include a microprocessor circuit and memory. In these examples, the memory stores executable instructions that are loaded into and executed by the microprocessor to carry out the functions of the controller 312, for instance the functions of one or more of the elements 308, 310, 323, 336, and 338.

Figure 4:
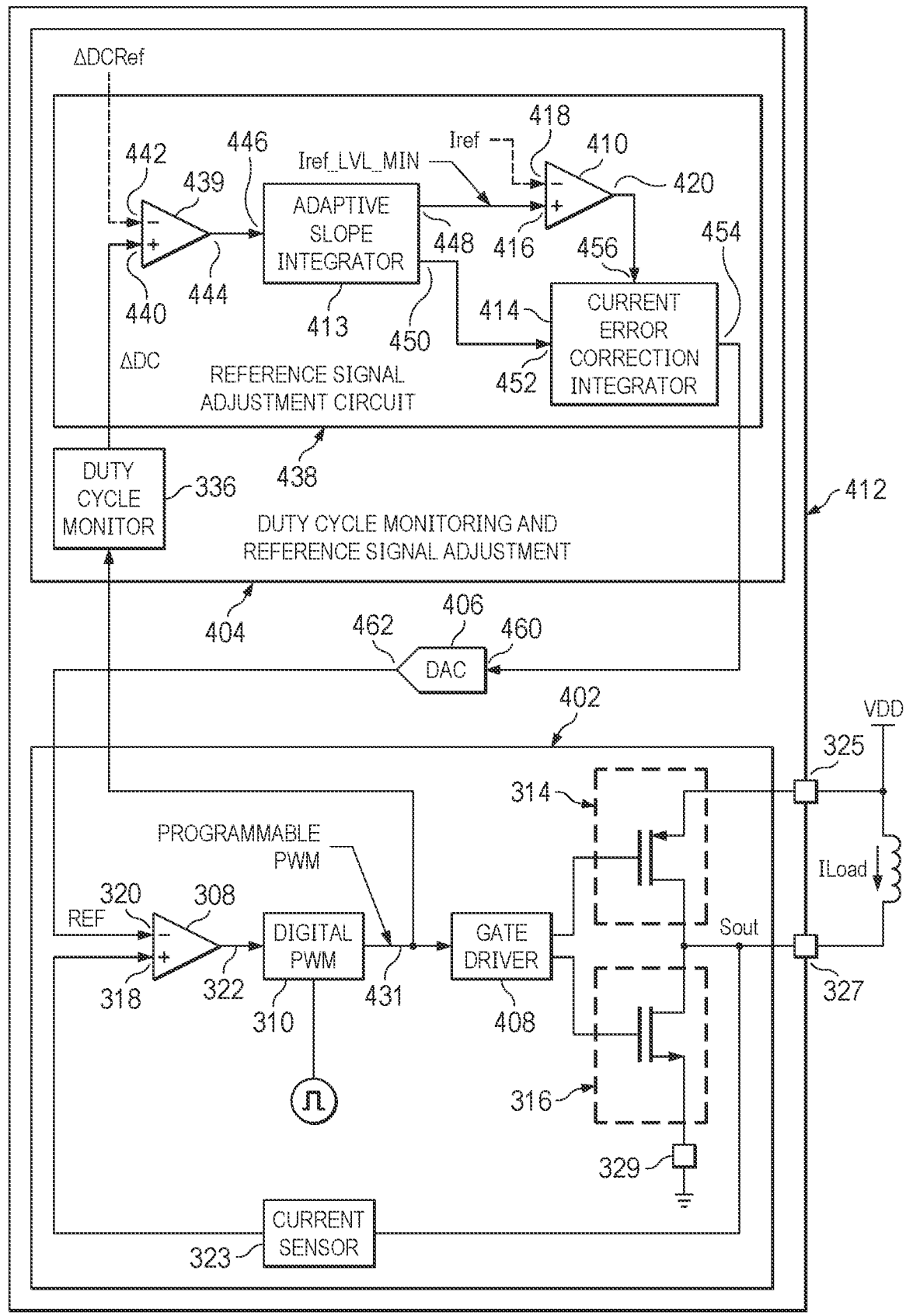
FIG. 4 is another circuit schematic of an example electromechanical system including a solenoid with adaptive slope compensation.

FIG. 4 illustrates an example of a controller 412 that may implement the functions of the controller 112 used to drive current (ILoad) through the conductive coil 108. Controller 412 is generally consistent with the features of controller 312 of FIG. 3, with like reference numerals being labeled with the same reference numbers, but including additional features relative to controller 312.

Controller 412 includes an analog circuit 402 and a digital circuit 404. Controller 412 further includes a digital-to-analog converter (DAC) 406 arranged between the analog circuit 402 and the digital circuit 404. The analog circuit 402 includes amplifier 308, PWM controller 310, a gate driver 408, high-side switch 314, and low-side switch 316. The gate driver 408 has an input coupled to an output of the PWM controller 310. The gate driver 408 has a first output coupled to a control terminal of the high-side switch 314, and a second output coupled to a control terminal of the low-side switch 316. The gate driver 408 may be implemented as an inverter or buffer in some examples. In this example, PWM controller 310 is implemented as a digital PWM controller. The digital PWM controller 310 can be programmable, for example by providing a multi-bit control word, a current level, and/or voltage level that sets the duty cycle of the PWM signal 431.

The digital circuit 404 includes the duty cycle monitoring circuit 336 and reference signal adjustment circuit 438. The reference signal adjustment circuit 438 may implement the functions of the controller reference signal adjustment circuit 338 in FIG. 3. The reference signal adjustment circuit 438 includes a duty cycle comparator 439, a current comparator 410, a first integrator 413, and a second integrator 414, which are operably coupled as shown. The duty cycle comparator 439 can include a first input 440, second input 442, and output 444. The first integrator 413 includes an input 446, first output 448, and second output 450. The second integrator includes a first input 452, second input 456, and output 454. The current comparator 410 includes a first input 416, second input 418, and output 420.

In some cases, the illustrated components of digital circuit 404 may be implemented as a microprocessor and memory, wherein the memory stores executable instructions that are executed by the microprocessor. The microprocessor and memory may be included on the same chip as the analog circuit 402, or can be on a separate chip from the analog circuit 402. Alternatively, the illustrated components of the digital circuit 404 may be implemented as an application specific integrated circuit (ASIC) that includes logic blocks (e.g., transistors) that are coupled together to achieve the circuitry illustrated as hardware. The described examples could also be implemented as a programmable gate array, such as a field programmable gate array (FPGA) or other programmable logic devices, which can be on the same chip or different chip than analog circuit 402. Thus, controllers 112, 312, and/or 412 can be solely hardware, and/or can be a combination of hardware, software, and firmware, depending on in the implementation.

The first input 440 of the duty cycle comparator 439 is coupled to the output of the duty cycle monitor 336. The first integrator 413, which is referred to as an adaptive slope integrator, includes a first integrator input 446 and a first integrator output 448. The first integrator input 446 is coupled to the duty cycle comparator output 444. The first integrator output 448 is coupled to the first input 416 of the current comparator 410. The second integrator 414, which is referred to as a current error correction integrator, includes a first input 452 and an output 454. A second input 456 of the second integrator 414 is coupled to the output 420 of the current comparator 410. The output 454 of the second integrator 414 is coupled to an input 460 of the DAC 406. An output 462 of the DAC is coupled to the input 320 of amplifier 308. The current comparator output 420 is coupled to the second amplifier input 320 via the second integrator 414. The DAC 406 converts a digital signal, such as a multi-bit digital word received from 460 to a single-ended or differential analog signal at 462.

Figure 5:
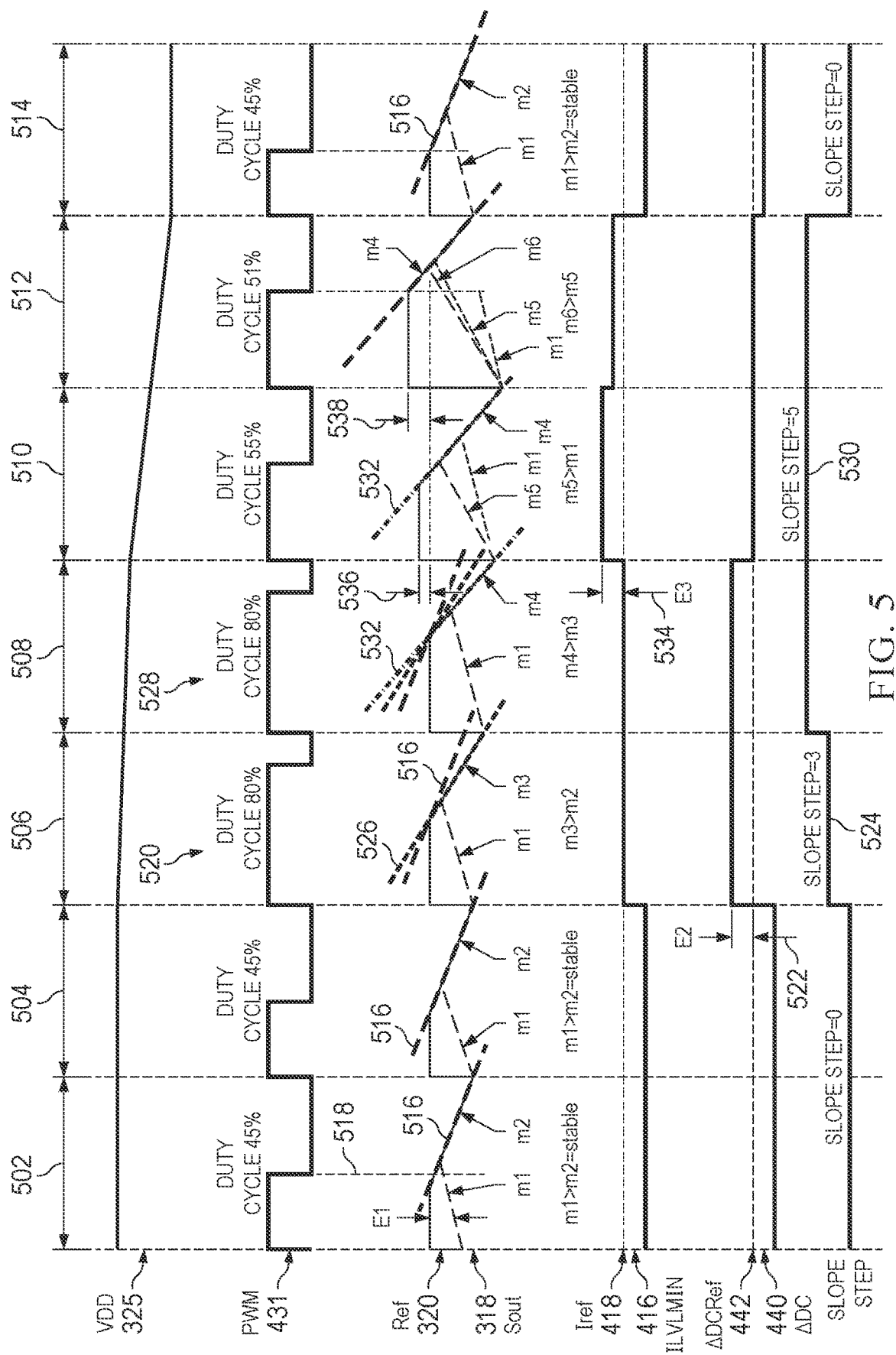
FIG. 5 is an example waveform diagram for driving a solenoid consistent with some examples of FIG. 4.

FIG. 5 illustrates a set of example waveforms used to explain operation of controller 412. The waveforms include a PWM signal 431, duty cycle difference ΔDC, and duty cycle difference reference or threshold ΔDCRef. The PWM signal includes multiple PWM clock cycles 502, 504, 506, 508, 510, 512, 514 (collectively referred to as 502-514), with each PWM clock cycle having the same fixed period of time. For each PWM clock cycle 502-514, the PWM signal 431 has a duty cycle, which is the percentage of time the PWM signal is active (e.g., high in this example (or low in other examples)) for a given PWM clock cycle. For example, during a first PWM clock cycle 502, the PWM signal 431 is high for 45% of the first PWM clock cycle 502 and is low for 55% of the first PWM clock cycle 502. Accordingly, the duty cycle for the first PWM clock cycle is said to be 45%. Similarly, during a sixth PWM clock cycle 512, the PWM signal 431 is high for 51% of the PWM clock cycle 512 and is low for 49% of the PWM clock cycle 502, such that the duty cycle for the PWM clock cycle 512 is said to be 51%.

During the first PWM clock cycle 502, the reference signal (Ref) on 320 is at a first level for a first portion of the first PWM clock cycle, then decreases according to a first slope m1 (see line 516). By comparing the Ref on 320 to output signal Sout on 318, the amplifier 308 provides a first error signal E1 on 322 that represents a difference between the Ref and Sout. Ref and Sout can either be voltages or can be currents. Based on this first error signal E1, PWM controller 310 sets the duty cycle for PWM signal 431 to 45% during the first PWM clock cycle 502. Responsive to the PWM signal 431 being high, the gate driver 408 provides a high voltage to the control terminal of PMOS transistor 314 and a low voltage to control terminal of NMOS transistor 316, and thereby "pulls up" the output signal Sout on 318 according to slope m1.

At time 518, Sout reaches Ref, in which the error signal E1 is zero or substantially zero. In response to this change in error signal, the digital PWM controller 310 controls the gate driver 408 to provide a low voltage to the control terminal of the PMOS transistor and a high voltage to the control terminal of the NMOS transistor. This bias condition "pulls down" the output signal Sout according to slope m2 for the remainder of the first PWM clock cycle 502. The same operation occurs during a second PWM clock cycle 504, in which the digital circuit 404 again provides the same reference signal (Ref) with the first level and first slope. Thus, 502 and 504 represent a stable operating condition for the solenoid coil where supply voltage VDD on 325 and other conditions are stable. At some point during operation, the reference signal (Ref) is provided with the same shape (e.g., slope m2) as in 502 and 504, but the duty cycle changes in response to changing operating conditions.

For example, in the third PWM clock cycle 506, a change in operating condition in the form of a decrease in the supply voltage level on 325 is present. In response to the decrease in VDD, the duty cycle increases to 80% (see 520), as evidenced by the increase in second error signal E2 on 344 (see 522). Specifically, the ΔDC on 340 is more than the threshold amount ΔDCRef on 342, and second error signal E2 goes high. In response, the adaptive slope integrator 413 increases the slope step to 3 (see 524), which in turn increases the slope of the reference signal on 320 to slope m3 (see 526), wherein m3>m2. This increase in the slope is in an attempt to mitigate the change in duty cycle to keep the solenoid coil in a stable operating mode.

In the fourth PWM clock cycle 508, the supply voltage level on 325 continues to drop, and the duty cycle remains at 80% (see 528). As such, the adaptive slope integrator 413 increases the slope step to 5 (see 530). Responsively, the current comparator 410 and the output of the second integrator 414 collectively operate such that the slope of the reference signal on 320 is increased to slope m4 (see 532), wherein m4>m3.

During the fifth PWM clock cycle 510, the change is slope to m4 has started to improve the duty cycle to bring it back into a more stable operating range. However, the duty cycle is still slightly elevated, as a duty cycle of less than 50% is generally desired for stable operation. Because the duty cycle is now less than a threshold amount during 510, no further slope adjustments are made, so the slope of Ref signal on 320 remains at slope m4. However, because ILVLMin on 418 is greater than the threshold Iref during fifth PWM clock cycle 510, the current error correction integrator 414 increases the magnitude of Ref on 320 (see 536). This increases the current provided to the solenoid coil to slope m5 (m5>m1) in an attempt to provide a smaller adjustment to the duty cycle.

During the sixth PWM clock cycle 512, the duty cycle continues to come back into a more stable operating range, but is still slightly elevated. Again, the slope of Ref signal on 320 remains at slope m4, and because ILVLMin on 418 is greater than the threshold Iref, the current error correction integrator 414 again increases the magnitude of Ref on 320 (see 538). This again increases the current provided to the solenoid coil (e.g., to slope m6, where m6>m5) in an attempt to provide a smaller adjustment to the duty cycle.

In the seventh PWM clock cycle 514, the change in reference signal slope and magnitude has effectuated the desired change, and the PWM signal returns to its desired/ stable operating range. As such, the reference signal Ref and slope step are reset to their initial levels. In this way, the controller 412 provides adaptive current and slope compensation to maintain stability for the solenoid over a wide range of dynamic operation conditions.

Figure 6:
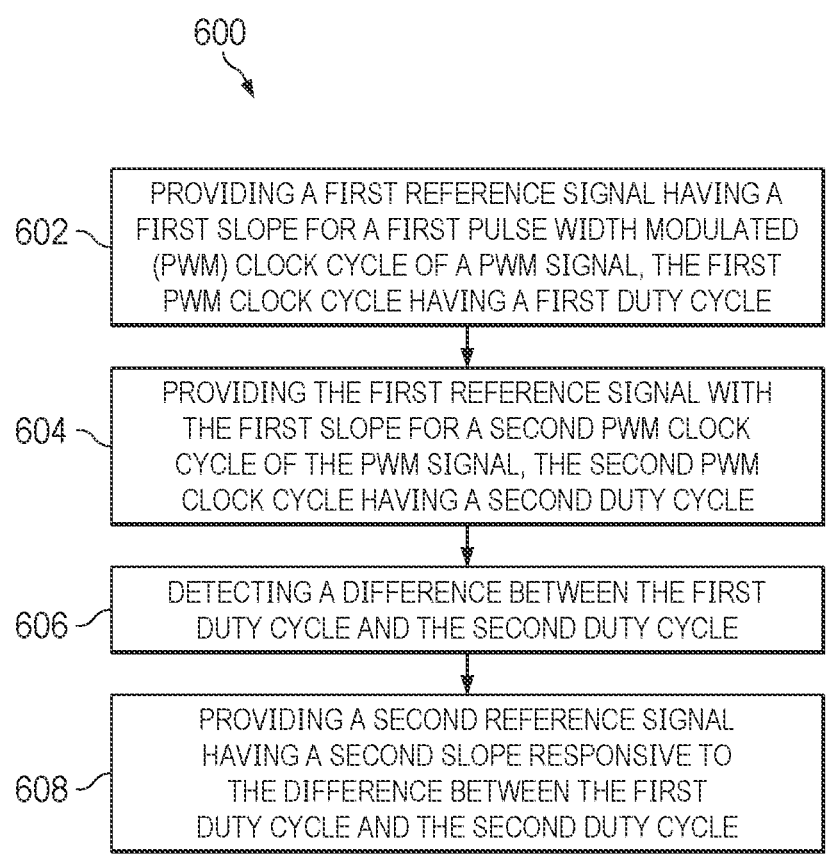
FIG. 6 is an example flowchart illustrating a method of using adaptive slope compensation.

FIG. 6 illustrates an example method 600 using adaptive slope compensation. For instance, the controller 412 of FIG. 4 performs the method 600. At 602, during a first PWM clock cycle of a PWM signal, a first reference signal is provided. The first reference signal a first slope during the first PWM clock cycle. The first PWM clock cycle has a first duty cycle. For example, FIG. 5 illustrates the PWM signal 431 including the first PWM clock cycle 502 having a first duty cycle of 45% responsive to the digital circuit 404 providing a first reference signal (Ref) having a slope of m2.

At 604, the first reference signal is provided with the first slope for a second PWM clock cycle of the PWM signal. The second PWM clock cycle has a second duty cycle For example, FIG. 5 described an example where the same reference signal having the same slope (m2) was provided for a second PWM clock cycle 506, but a change in operating conditions induced a change in the first duty cycle to a second duty cycle of 80%.

At 606, the method detects a difference between the first duty cycle and the second duty cycle.

At 608, the method provides a second reference signal having a second slope responsive to the difference between the first duty cycle and the second duty cycle. For example, in FIG. 5, the slope of the reference signal was increased to 526 in fourth PWM clock cycle 508.

In some examples, the second duty cycle is greater than the first duty cycle, and the second slope is greater than the first slope. For example, in FIG. 5, the duty cycle increase from 45% to 80% and the slope increases from m2 to m3, or even from m3 to m4.

In some examples, the first reference signal has a first initial magnitude and the second reference signal has a second initial magnitude equal to the first initial magnitude. For instance, in FIG. 5, Ref signal on 320 for times 502-508 each have equal initial magnitudes.

In some examples, the method further includes detecting a difference between the second duty cycle and a subsequent duty cycle. The difference between the second duty cycle and the subsequent duty cycle is compared to a reference duty cycle difference. A subsequent reference signal having the first slope is provided in response to the difference between the second duty cycle and the subsequent duty cycle being less than the reference duty cycle difference. For example in seventh PWM clock cycle 514, the slope "resets" from m4 in sixth PWM clock cycle 512 back to slope m2 in seventh PWM clock cycle 514 because the change in duty cycle 340 is less than the reference duty cycle on 42 in sixth PWM clock cycle 512.

In some examples, the second reference signal having the second slope is provided for a third PWM clock cycle of the PWM signal. The third PWM clock cycle has a third duty cycle. The method can also detect a difference between the second duty cycle and the third duty cycle. A third reference signal having the second slope and an initial reference magnitude that is greater than an initial reference magnitude of the second reference signal is provided for the third PWM clock cycle. For example, in fifth PWM clock cycle 510, the slope (m4) of the Ref signal on 320 remains the same as in sixth PWM clock cycle 512, but the initial reference magnitude is increased (see 536).

Figure 7:
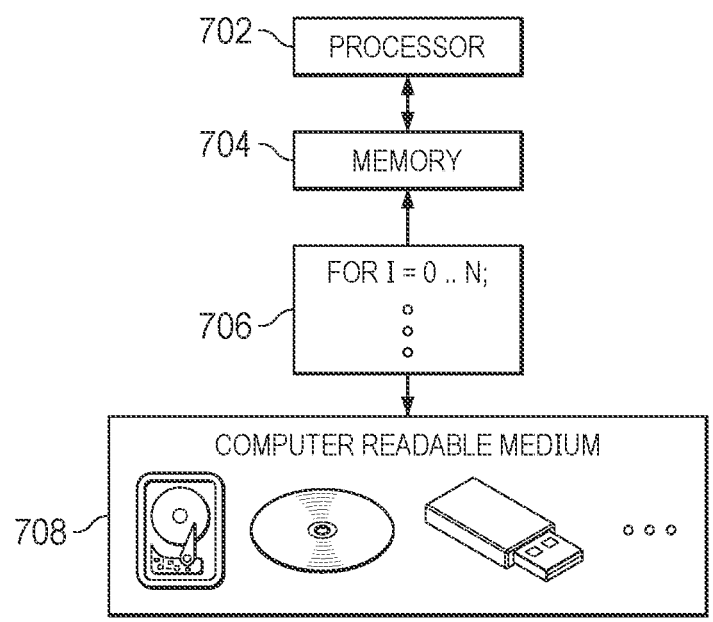
FIG. 7 is a diagram illustrating a processor and memory, along with a computer readable medium in some examples.

Although FIG. 6 shows a method 600 as a flowchart, it will be appreciated that other methods are also described in the operating principles of the illustrated systems and waveforms. Further the methods are illustrated and described above as a series of operations or events, but the illustrated ordering of such operations or events is not limiting. For example, some operations or events may occur in different orders and/or concurrently with other operations or events apart from those illustrated and/or described herein. Also, some illustrated operations or events are optional to implement one or more aspects or examples of this description. Further still, one or more of the operations or events depicted herein may be performed in one or more separate operations and/or phases. In some examples, such as shown in FIG. 7, the methods described herein may be implemented system that includes a processor 702 and a memory 704. The processor 702 can execute instructions 706 that are stored in the memory 704 to implement the operations and/or functions described herein. These instructions 706 can be stored on a computer readable medium 708, and this computer readable medium 708 can allow the instructions 706 to be disseminated to customers/users. The computer readable medium 708 can take a variety of forms, and can include a solid state memory device, an optical fiber, a copper wire, and/or an electromagnetic signal modulated to convey data. Solid state memory devices can include volatile memory, non-volatile memory, optical memory, static dynamic access random memory (SRAM), dynamic random access memory (DRAM), compact disc (CD) memory, flash memory, ferroelectric memory, ferromagnetic memory, resistive random access memory (RRAM), among others.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. In other cases, the devices described herein are "configurable to" perform a task or function, meaning that the hardware present in the device is suitable to be programmed after manufacturing to perform the function via firmware and/or software programming of the device, and the firmware and/or software is not included at the time of manufacture.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor, a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of that parameter.

Modifications are possible in the described examples, and other implementations are possible, within the scope of the claims.

What is claimed is:

1. A circuit, comprising:
    an amplifier having a first input, a reference input, and an output;
    a pulse width modulator (PWM) controller having an input coupled to the output of the amplifier and having an output;
    a first switch having a first terminal, a second terminal, and a control terminal, the control terminal of the first switch coupled to the output of the PWM controller;
    a second switch having a first terminal, a second terminal, and a control terminal, the second terminal of the second switch coupled to the second terminal of the first switch, and the control terminal of the second switch coupled to the output of the PWM controller; and
    a regulator having an input coupled to the output of the PWM controller and having an output coupled to the reference input of the amplifier, the regulator including:
        a first circuit having an input coupled to the output of the PWM controller and having an output;
        a first comparator having a first input, a second input, and an output, the first input of the first comparator coupled to the output of the first circuit; and
        a first integrator having a first input and a first output, the first input of the first integrator coupled to the output of the first comparator and the first output of the first integrator coupled to the reference input of the amplifier.

2. The circuit of claim 1, wherein the first comparator is configured to receive a reference duty cycle difference at the second input.

3. The circuit of claim 2 further comprising a current sensor having an input and an output, the input of the current sensor coupled to the second terminal of the first switch and coupled to the second terminal of the second switch, and the output of the current sensor coupled to the first input of the amplifier.

4. The circuit of claim 3, wherein the regulator includes:
    a second integrator having an input and an output, the input of the second integrator coupled to the first output of the first integrator and the output of the second integrator coupled to the reference input of the amplifier.

5. The circuit of claim 4, wherein the regulator includes:
    a second comparator having a first input, a second input, and an output, the first input of the second comparator coupled to a second output of the first integrator, and the output of the second comparator coupled to the second integrator.

6. The circuit of claim 3, wherein the regulator includes:
    a second comparator having a first input, a second input, and an output, the first input of the second comparator coupled to the output of the first comparator, and the output of the second comparator coupled to the reference input of the amplifier.

7. The circuit of claim 1, wherein the regulator is configured to monitor a pulse-width-modulated signal on the output PWM controller and adjust a reference signal provided to the reference input of the amplifier responsive to a difference between a first duty cycle of the pulse-width-modulated signal and a second duty cycle of the pulse-width-modulated signal.

8. The circuit of claim 1, wherein the regulator is configured to monitor a pulse-width-modulated signal on the output of the PWM controller and change a slope of a reference signal provided to the reference input of the amplifier, wherein the change in the slope is based on a difference between first and second pulse-width-modulated clock cycles of the pulse-width-modulated signal.

9. The circuit of claim 8, wherein the regulator is configured to increase the slope of the reference signal when the difference between the first and second pulse-width-modulated clock cycles exceeds a threshold.

10. A circuit comprising:
a first switch having a first terminal, a second terminal, and a control terminal, the first terminal of the first switch coupled to a first supply voltage terminal;
a second switch having first terminal, a second terminal, and a control terminal, the first terminal of the second switch coupled to a second supply voltage terminal, and the second terminal of the second switch coupled to the second terminal of the first switch;
a pulse width modulator (PWM) controller having an input and an output, the output configured to provide a PWM signal to the control terminal of the first switch and a to the control terminal of the second switch;
an amplifier having a first input terminal, a second input terminal, and an output terminal, the first input terminal of the amplifier coupled to the second terminal of the first switch and to the second terminal of the second switch, and the second input terminal of the amplifier configured to receive a reference signal; and
a regulator having an input coupled to the output of the PWM controller and having an output coupled to the second input terminal of the amplifier, the regulator including:
a comparator configured to compare a change in duty cycle of the PWM signal to a threshold; and
an integrator configured to change a slope of the reference signal based on the change in duty cycle of the PWM signal.

11. The circuit of claim 10, further including:
a current sensor having an input and an output, the input of the current sensor coupled to the second terminal of the first switch and coupled to the second terminal of the second switch, and the output of the current sensor coupled to the first input terminal of the amplifier.

12. The circuit of claim 11, wherein the regulator is configured to increase the slope of the reference signal when a duty cycle difference between PWM clock cycles of the PWM signal exceeds the threshold.

13. The circuit of claim 10, wherein the regulator includes:
a first circuit having an input coupled to the output of the PWM controller and having an output; and
a second circuit having a first input, a duty cycle reference input, and an output, the first input of the second circuit coupled to the output of the first circuit, and the output of the second circuit coupled to the second input terminal of the amplifier.

14. The circuit of claim 13, wherein the second circuit includes the comparator and the integrator,
the comparator having a first input, a second input, and an output, the first input of the comparator coupled to the output of the first circuit, the second input of the comparator coupled to a duty cycle reference input that receives the threshold; and
the integrator having a first input and a first output, the first input of the integrator coupled to the output of the comparator and the first output of the integrator coupled to the second input of the amplifier.

15. The circuit of claim 14, wherein the second circuit includes:
a second integrator having an input and an output, the input of the second integrator coupled to the first output of the first integrator and the output of the second integrator coupled to the second input of the amplifier.

16. A circuit, comprising:
an amplifier having a first input, a reference input and an output;
a pulse width modulator (PWM) controller having an input coupled to the output of the amplifier and having an output;
a switching circuit having an input and an output, the input of the switching circuit coupled to the output of the PWM controller, and the output of the switching circuit coupled to the first input of the amplifier; and
a regulator having an input coupled to the output of the PWM controller and having an output coupled to the reference input of the amplifier, the regulator configured to:
provide a first reference signal having a first slope at the reference input of the amplifier, the first reference signal provided for a first PWM clock cycle of a PWM signal;
provide the first reference signal with the first slope at the reference input of the amplifier, the first reference signal provided for a second PWM clock cycle of the PWM signal, the first PWM clock cycle having a first duty cycle and the second PWM clock cycle having a second duty cycle;
detect a difference between the first duty cycle and the second duty cycle; and
provide a second reference signal, at the reference input of the amplifier, having a second slope responsive to the difference between the first and the second duty cycle.

17. The circuit of claim 16, wherein the second duty cycle is greater than the first duty cycle, and the second slope is greater than the first slope.

18. The circuit of claim 16, wherein the regulator is further configured to:
detect a difference between the second duty cycle and a subsequent duty cycle;
compare the difference between the second duty cycle and the subsequent duty cycle to a reference duty cycle difference; and
provide a subsequent reference signal at the reference input of the amplifier, the subsequent reference signal having the first slope in response to the difference between the second duty cycle and the subsequent duty cycle being less than the reference duty cycle difference.

19. The circuit of claim 16, wherein the regulator is further configured to:
provide the second reference signal with the second slope at the reference input of the amplifier, the second reference signal provided for a third PWM clock cycle of the PWM signal, the third PWM clock cycle having a third duty cycle;
detect a difference between the second duty cycle and the third duty cycle; and
provide a third reference signal, at the reference input of the amplifier, having a third slope responsive to the difference between the second and the third duty cycle.

20. The circuit of claim 16, wherein regulator further comprising:
a duty cycle monitoring circuit having an input coupled to the output of the PWM controller and having an output; and
a reference signal adjustment circuit having a first input, a duty cycle reference input, and an output, the first input of the reference signal adjustment circuit coupled to the output of the duty cycle monitoring circuit, and the output of the reference signal adjustment circuit coupled to the reference input of the amplifier.

\* \* \* \* \*